(12) United States Patent
Takehara

(10) Patent No.: US 12,672,518 B2
(45) Date of Patent: Jun. 30, 2026

(54) HEAT TREATMENT SUSCEPTOR AND HEAT TREATMENT APPARATUS

(71) Applicant: SCREEN Holdings Co., Ltd., Kyoto (JP)

(72) Inventor: Hiroyasu Takehara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 1057 days.

(21) Appl. No.: 17/836,554

(22) Filed: Jun. 9, 2022

(65) Prior Publication Data

US 2023/0091404 A1     Mar. 23, 2023

(30) Foreign Application Priority Data

Sep. 17, 2021     (JP) ................................. 2021-152076

(51) Int. Cl.
*H10P 72/76* (2026.01)
*H05B 3/00* (2006.01)
*H10P 72/00* (2026.01)

(52) U.S. Cl.
CPC ....... *H10P 72/7624* (2026.01); *H05B 3/0047* (2013.01); *H10P 72/0436* (2026.01); *H10P 72/7614* (2026.01)

(58) Field of Classification Search
CPC ........... H01L 21/67115; H01L 21/6875; H01L 21/68785; H05B 3/0047
USPC ....................................................... 392/418
See application file for complete search history.

(56) References Cited

U.S. PATENT DOCUMENTS

| | | |
|---|---|---|
| 6,146,504 A | 11/2000 | Patadia et al. |
| 8,434,341 B2 | 5/2013 | Camm et al. |
| 9,627,244 B2 | 4/2017 | Camm et al. |
| 2007/0006806 A1 | 1/2007 | Imai et al. |
| 2008/0157452 A1 | 7/2008 | Camm et al. |
| 2011/0168330 A1 | 7/2011 | Sakaue et al. |
| 2012/0088203 A1 | 4/2012 | Mizunaga et al. |
| 2018/0261479 A1 | 9/2018 | Ito et al. |
| 2019/0080951 A1 | 3/2019 | Huston et al. |
| 2019/0252205 A1 | 8/2019 | Furukawa |
| 2019/0267261 A1 | 8/2019 | Akiyoshi et al. |

FOREIGN PATENT DOCUMENTS

| | | |
|---|---|---|
| CN | 102163573 A | 8/2011 |
| JP | 2003-318183 A | 11/2003 |
| JP | 2004-296482 A | 10/2004 |

(Continued)

OTHER PUBLICATIONS

Notice of Decision to Grant dated Nov. 11, 2024 in corresponding Korean Patent Application No. 10-2022-0105985.

(Continued)

*Primary Examiner* — Sang Y Paik
(74) *Attorney, Agent, or Firm* — OSTROLENK FABER LLP

(57) ABSTRACT

A heat treatment susceptor holds a substrate when the substrate is irradiated with a flash of light from flash lamps to perform a heat treatment on the substrate. The heat treatment susceptor includes: a holding plate having a planar holding surface; and a plurality of substrate support bodies mounted upright on the holding surface, wherein a slit is formed around a position where at least one of the substrate support bodies is mounted upright in the holding plate, and the slit includes at least one bending portion or a corner portion.

5 Claims, 12 Drawing Sheets

(56)                    References Cited

FOREIGN PATENT DOCUMENTS

| | | | |
|---|---|---|---|
| JP | 2004-336067 | A | 11/2004 |
| JP | 2009-177062 | A | 8/2009 |
| JP | 2014-011436 | A | 1/2014 |
| JP | 2015-065458 | A | 4/2015 |
| JP | 2017-204566 | A | 11/2017 |
| JP | 2020-533806 | A | 11/2020 |
| KR | 10-2019-0080682 | A | 7/2019 |
| KR | 10-2019-0098039 | A | 8/2019 |
| TW | 201222673 | A1 | 6/2012 |
| TW | 201937564 | A | 9/2019 |
| WO | WO 2004/086496 | A1 | 10/2004 |

OTHER PUBLICATIONS

Office Action and Search Report dated Mar. 2, 2023 in corresponding Taiwanese Patent Application No. 111129086 and English translation made from Japanese translation of the original communication.
Notification of Granting Patent Right of Invention with Search Report dated Jul. 1, 2025 in corresponding Chinese Patent Application No. 202210835609.5.
Request for the Submission of an Opinion dated Mar. 20, 2024 in corresponding Korean Patent Application No. 10-2022-0105985 and a computer generated English translation obtained from the JPO.
Notice of Reasons for Refusal dated Aug. 12, 2025 in corresponding Japanese Patent Application No. 2021-152076.

74

78    78t    78
78t                    78t    75a
77         77              75
79                              79
76
78t                              78t
78                              78
77    78    78e  78e    77
78e                        78e
78t    78                      78
78    77              77    78
A                              78t
A
78e                        78e
79    78                      79
78e  78e
78t                              78t
78         78e  78e         78
77                              77
78t    78              78    78t
77
78t    78              77    78
78t
78                78t
78

76   75a                           W                    74
78   77              75              77  78

F I G. 7
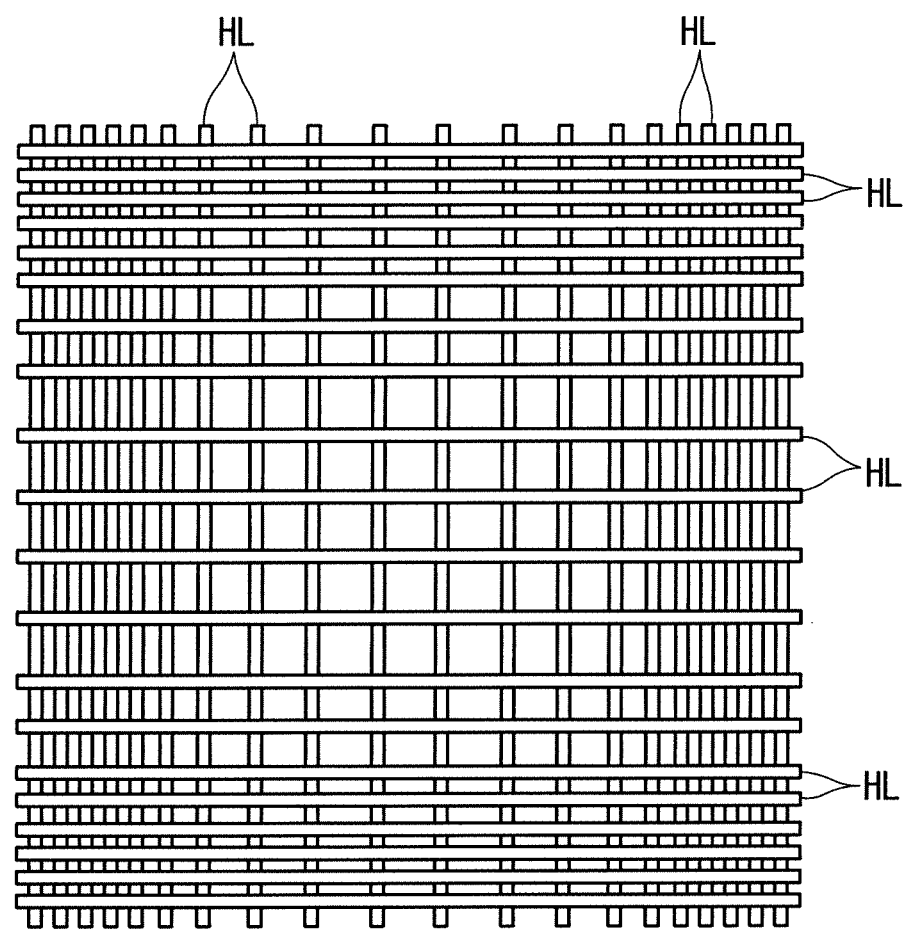
F I G. 8
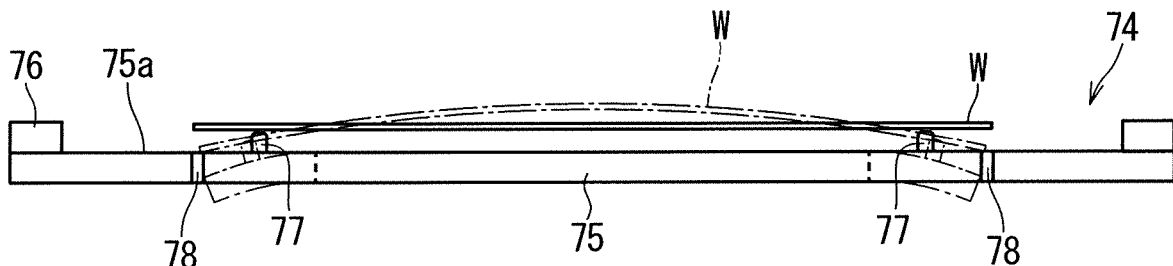

F I G. 9
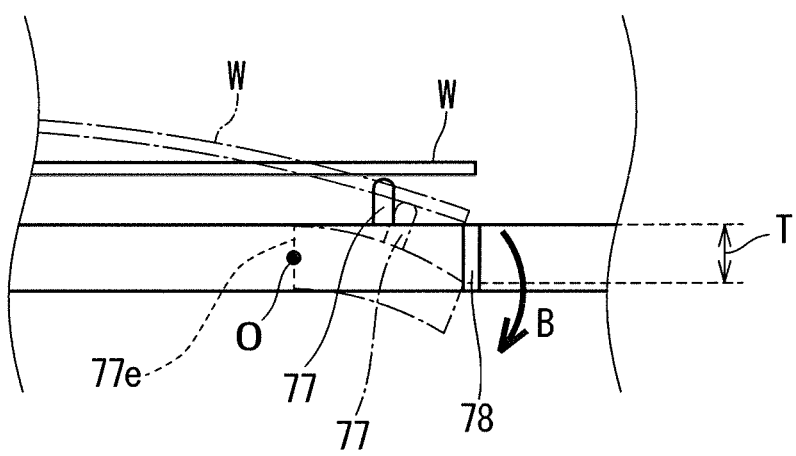

F I G. 1 0
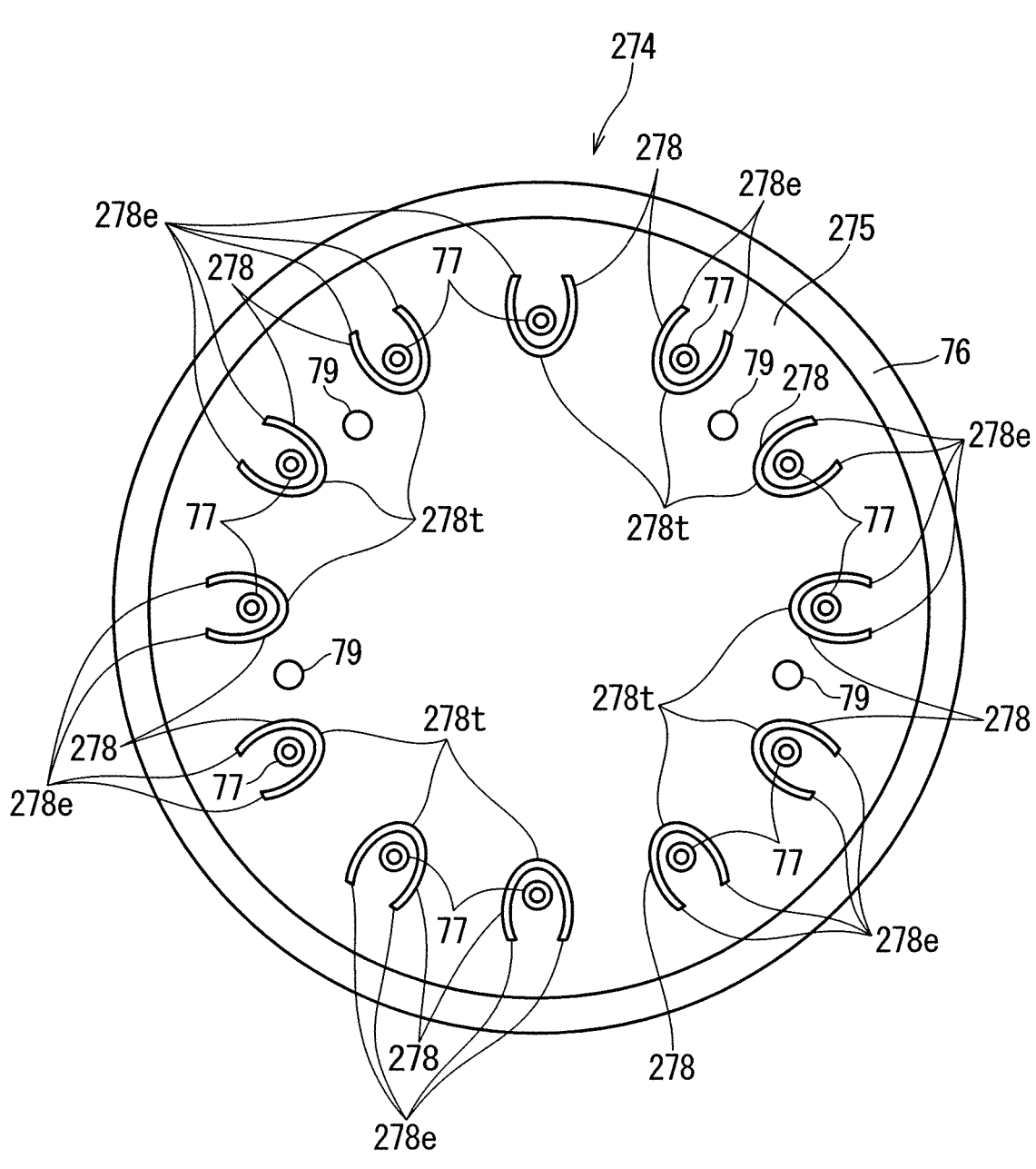

F I G. 11
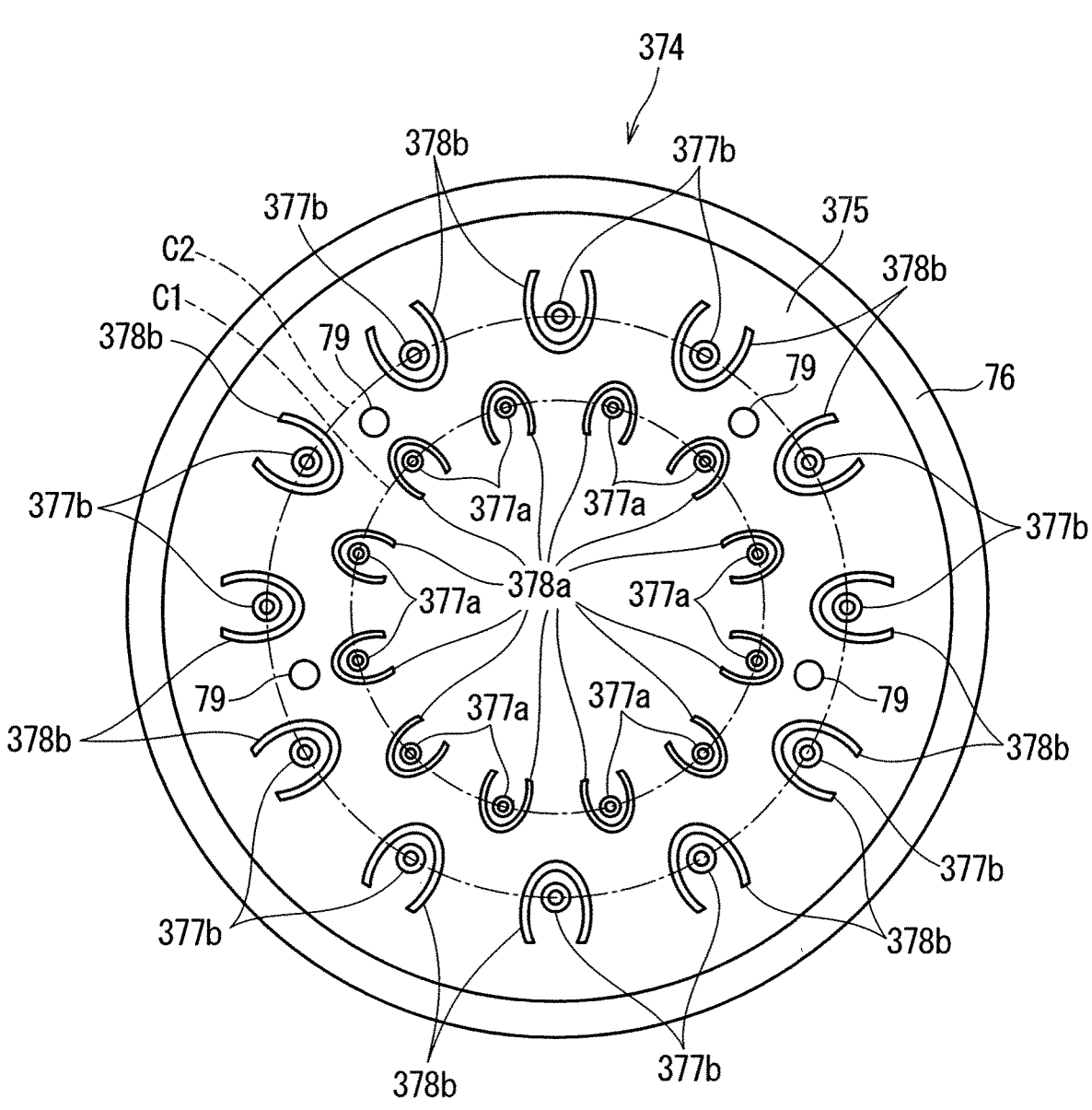

F I G. 12
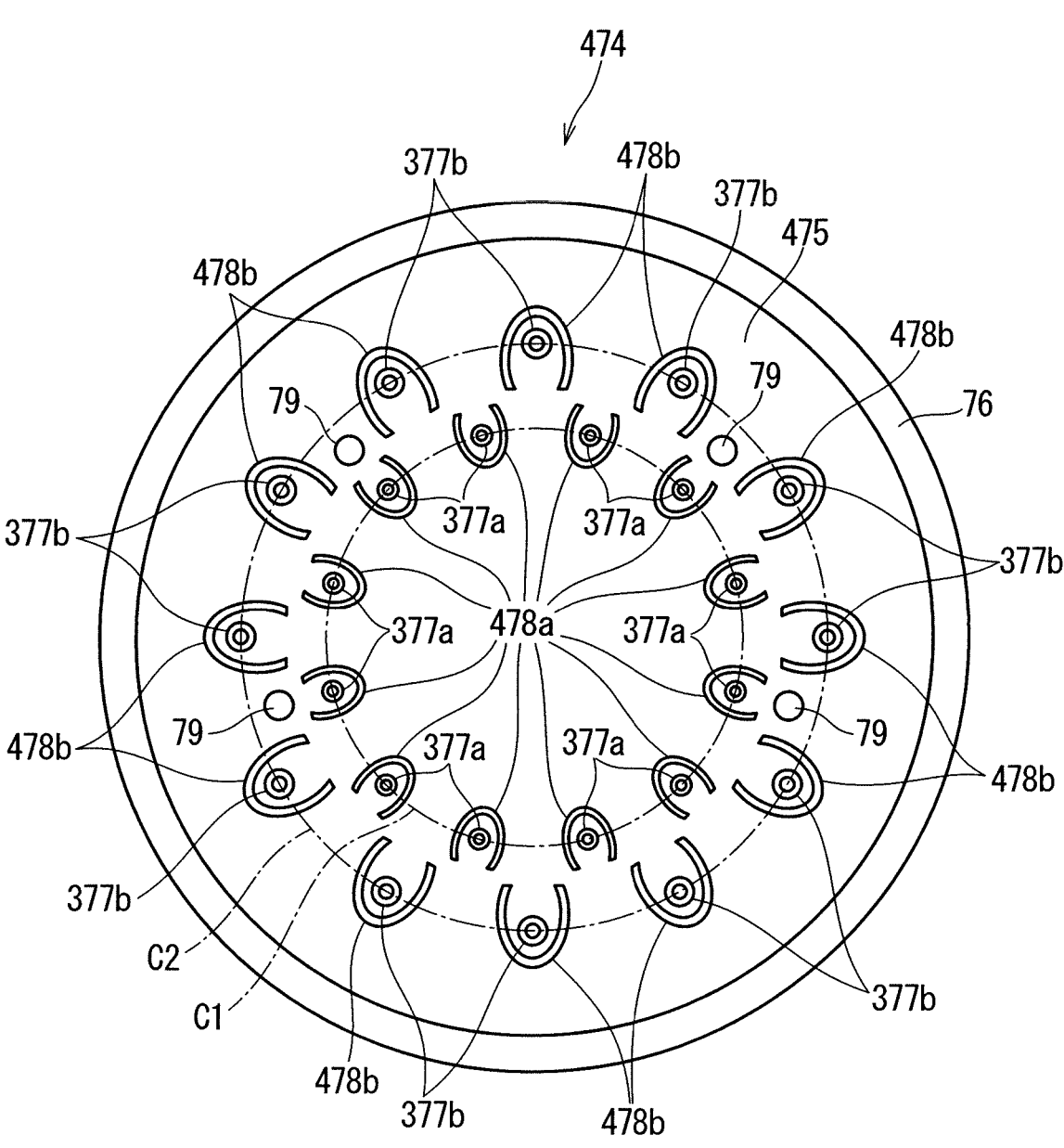

HEAT TREATMENT SUSCEPTOR AND HEAT TREATMENT APPARATUS

BACKGROUND OF THE INVENTION

Field of the Invention

The present invention relates to a heat treatment susceptor holding a thin plate-like precision electronic substrate (simply referred to as "the substrate" hereinafter) such as a semiconductor wafer when the substrate is irradiated with a flash of light from flash lamps so that a heat treatment is performed on the substrate, and also relates to a heat treatment apparatus including the heat treatment susceptor.

Description of the Background Art

Impurity introduction is a necessary step for forming a pn junction in a semiconductor wafer in a process of manufacturing a semiconductor device. Currently, the impurity introduction is generally performed by an ion implantation method and a subsequent annealing method. The ion implantation method is a technique of ionizing atoms of impurity such as boron (B), arsenic (As), or phosphorus (P), and bombarding a semiconductor wafer with ionized atoms at high acceleration voltage, thereby physically performing ion implantation. The implanted impurity is activated by an annealing treatment. At this time, when an annealing time is equal to or longer than approximately several seconds, there is a possibility that the implanted impurity is deeply diffused by heat, and as a result, a junction depth is deeper than necessary, and this causes an obstacle in favorably forming a device.

A flash lamp anneal (FLA) recently attracts attention as an annealing technique of heating a semiconductor wafer for an extremely short time. The flash lamp anneal is a heat treatment technique of irradiating a surface of a semiconductor wafer with a flash of light using a xenon flash lamp (a simple term of "a flash lamp" means a xenon flash lamp hereinafter), thereby increasing a temperature of only the surface of the semiconductor wafer into which an impurity is implanted in an extremely short time (several milliseconds or less).

A radiation spectral distribution of the xenon flash lamp ranges from an ultraviolet region to a near-infrared region, thus a wavelength of the xenon flash lamp is shorter than that of a conventional halogen lamp, and almost coincides with a basic absorption band of a silicon semiconductor wafer. Thus, when the semiconductor wafer is irradiated with a flash of light emitted from the xenon flash lamp, the temperature of the semiconductor wafer can be rapidly increased with less transmitted light. It is also known that a flash irradiation for the extremely short time of several milliseconds or less can selectively increase a temperature of only a region near the surface of the semiconductor wafer. Thus, when a temperature is increased by the xenon flash lamp for extremely a short time, only impurity activation can be performed without deeply diffusing the impurity.

In a heat treatment apparatus using the flash lamp, a flash of light is typically emitted from the flash lamp while a susceptor holds a semiconductor wafer. The flash lamp instantaneously emits a flash of light having extremely large energy to a front surface of the semiconductor wafer, thus a temperature of the front surface of the semiconductor wafer rapidly increases, however, a temperature of a back surface of the semiconductor wafer does not increase so much. Thus, rapid thermal expansion occurs only in the front surface of the semiconductor wafer, and the semiconductor wafer is deformed into a warped shape in which an upper surface is convexed. Then, in the next moment, the semiconductor wafer is deformed into a warped shape in which a lower surface is convexed with a rebound. As a result, there is a case where the semiconductor wafer is severely oscillated on the susceptor supporting the semiconductor wafer, and bounces from the susceptor, or furthermore, the semiconductor wafer or a support pin of the susceptor is broken on impact.

Accordingly, a support system of a semiconductor wafer is developed as with U.S. Pat. No. 8,434,341 or 9,627,244 to prevent breakage of the support pin caused by pressing force from the semiconductor wafer.

Specifically, proposed in U.S. Pat. Nos. 8,434,341 and 9,627,244 is a support system allowing a movement of a workpiece induced by heat (a movement in a vertical direction mutually related between an outer end region and a central part region of the workpiece) while supporting the workpiece regarding the movement in the vertical direction mutually related between the outer end region and the central part region of the workpiece.

However, a spring or an actuator, for example, are used as a configuration of allowing the movement of the workpiece induced by heat in the technique proposed in U.S. Pat. Nos. 8,434,341 and 9,627,244. The technique proposed in U.S. Pat. Nos. 8,434,341 and 9,627,244 having such a configuration has a complex device structure. Particularly, it is assumed that in a heat treatment apparatus using flash lamps, an inner side of the apparatus has a high temperature, thus also considered is deterioration or breakage of components due to the high temperature. Further attention is required to manage the components in such an apparatus proposed in U.S. Pat. Nos. 8,434,341 and 9,627,244.

SUMMARY OF THE INVENTION

The present invention is directed to a heat treatment susceptor holding a thin plate-like precision electronic substrate (simply referred to as "the substrate" hereinafter) such as a semiconductor wafer when the substrate is irradiated with a flash of light from flash lamps so that a heat treatment is performed on the substrate.

According to one aspect of the present invention, a heat treatment susceptor holds a substrate when the substrate is irradiated with a flash of light from flash lamps to perform a heat treatment on the substrate, the heat treatment susceptor includes: a holding plate having a planar holding surface; and a plurality of substrate support bodies mounted upright on the holding surface, wherein at least one slit is formed around a position where at least one of the substrate support bodies is mounted upright in the holding plate, and the slit includes at least one bending portion or one corner portion.

Even when load on the substrate support body is increased in accordance with a deformation of the substrate at a time of flash irradiation, a portion surrounded by the slit is deflected, thus the load on the substrate support body is absorbed. Accordingly, a bound and breakage of the substrate at a time of flash irradiation can be prevented with a simple configuration.

The present invention relates to a heat treatment apparatus including a heat treatment susceptor holding a substrate when the substrate is irradiated with a flash of light to perform a heat treatment on the substrate.

According to one aspect of the present invention, a heat treatment apparatus irradiating a substrate with a flash of light, thereby heating the substrate includes: a chamber housing the substrate; a heat treatment susceptor according to claim 1 disposed in the chamber; and flash lamps irradiating the substrate held by the heat treatment susceptor with the flash of light.

Even when load on the substrate support body is increased in accordance with a deformation of the substrate at a time of flash irradiation, a portion surrounded by the slit is deflected, thus the load on the substrate support body is absorbed. Accordingly, a bound and breakage of the substrate at a time of flash irradiation can be prevented with a simple configuration.

Therefore, an object of the present invention is to provide a heat treatment susceptor and a heat treatment apparatus capable of preventing a bound and breakage of a substrate at a time of flash irradiation with a simple configuration.

These and other objects, features, aspects and advantages of the present invention will become more apparent from the following detailed description of the present invention when taken in conjunction with the accompanying drawings.

BRIEF DESCRIPTION OF THE DRAWING

FIG. 7 is a plan view showing an arrangement of a plurality of halogen lamps HL.

FIG. 8 is an explanation diagram illustrating an action of a semiconductor wafer W held by a susceptor and a holding plate at a time of flash irradiation.

FIG. 9 is a partial enlarged view showing an enlarged substrate support pin and slit in FIG. 8.

FIG. 10 is a plan view of a susceptor according to a second embodiment.

FIG. 11 is a plan view of a susceptor according to a third embodiment.

FIG. 12 is a plan view of a susceptor according to a fourth embodiment.

DESCRIPTION OF THE PREFERRED EMBODIMENTS

Embodiments according to the present invention will now be described in detail with reference to the drawings.

First Embodiment

Figure 1:
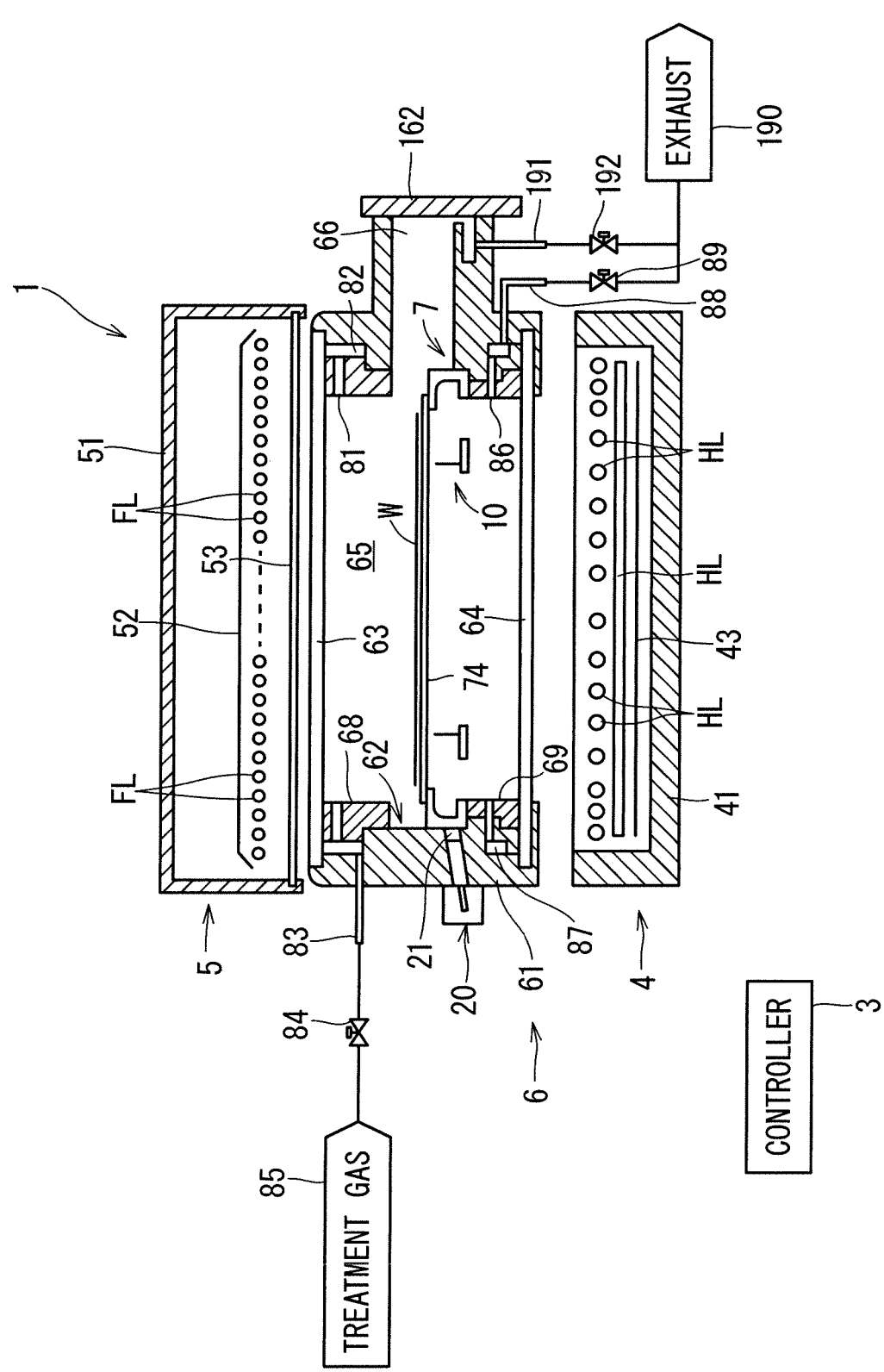
FIG. 1 is a longitudinal sectional view showing a configuration of a heat treatment apparatus according to the present invention.

FIG. 1 is a longitudinal sectional view illustrating a configuration of a heat treatment apparatus 1 according to the present invention. The heat treatment apparatus 1 according to the present embodiment is a flash lamp annealer for heating a disk-shaped semiconductor wafer W serving as a substrate by irradiating the semiconductor wafer W with a flash of light. A size of the semiconductor wafer W to be treated is not particularly limited. For example, the semiconductor wafer W to be treated has a diameter of 300 mm or 450 mm. An impurity is implanted into the semiconductor wafer W before being transported into the heat treatment apparatus 1, and a process of activating the implanted impurity is executed by a heat treatment in the heat treatment apparatus 1. It should be noted that dimensions of components and the number of components are illustrated in exaggeration or in simplified form, as appropriate, in FIG. 1 and the subsequent drawings for the sake of easier understanding.

The heat treatment apparatus 1 includes a chamber 6 for housing the semiconductor wafer W, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 includes a holding part 7 provided inside the chamber 6 and for holding the semiconductor wafer W in a horizontal attitude, and a transfer mechanism 10 provided inside the chamber 6 and for transferring the semiconductor wafer W between the holding part 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to execute a heat treatment on the semiconductor wafer W.

The chamber 6 is configured such that upper and lower chamber windows made of quartz are mounted to the top and bottom, respectively, of a tubular chamber side portion 61. The chamber side portion 61 has a generally tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from an upper side of the chamber side portion 61. The lower reflective ring 69, on the other hand, is mounted by being inserted upwardly from a lower side of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. That is to say, the recessed portion 62 is defined which is surrounded by a middle portion of the inner wall surface of the chamber side portion 61 where the upper and lower reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holding part 7 which holds the semiconductor wafer W.

The chamber side portion 61 and the upper and lower reflective rings 68 and 69 are formed of a metal material (for example, stainless steel) with high strength and high heat resistance. An inner peripheral surface of each of the upper and lower reflective rings 68 and 69 has a mirror surface with electrolytic nickel plating.

The chamber side portion 61 is provided with a transport opening (throat) 66 for the transport of the semiconductor wafer W therethrough into and out of the chamber 6. The transport opening 66 can be opened and closed by the gate valve 162. The transport opening 66 is communicably connected to an outer peripheral surface of the recessed portion 62. Thus, when the transport opening 66 is opened by the gate valve 162, the semiconductor wafer W can be transported through the transport opening 66 and the recessed portion 62 into and out of the heat treatment space 65. When the transport opening 66 is closed by the gate valve 162, the heat treatment space 65 in the chamber 6 is an enclosed space.

A radiation thermometer 20 is mounted in a location of an outer wall surface of the chamber side portion 61 where the through hole 61a is provided. The through hole 61a is a cylindrical hole for directing infrared radiation emitted from a lower surface of the semiconductor wafer W held by a susceptor 74 described hereinafter therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65.

A gas supply hole 81 for supplying a treatment gas (in the present embodiment, nitrogen gas (N2)) therethrough into the heat treatment space 65 is provided in an upper portion of the inner wall of the chamber 6. The gas supply hole 81 is provided in a position on an upper side of the recessed portion 62, and may be provided in the upper reflective ring 68. The gas supply hole 81 is communicably connected to a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, the nitrogen gas is supplied from the nitrogen gas supply source 85 to the buffer space 82. The nitrogen gas which has flowed into the buffer space 82 flows in a spreading manner within the buffer space 82 which is lower in fluid resistance than the gas supply hole 81, and is supplied through the gas supply hole 81 into the heat treatment space 65. The treatment gas is not limited to nitrogen gas, however, inactive gas such as argon (Ar) and helium (He) or reactive gas such as oxygen (O2), hydrogen (H2), chlorine (Cl2), hydrogen chloride (HCl), ozone (O3), ammonia (NH3) is also applicable.

A gas exhaust hole 86 for exhausting a gas from the heat treatment space 65 is provided in a lower portion of the inner wall of the chamber 6. The gas exhaust hole 86 is provided in a lower side position than the recessed portion 62, and may be provided in the lower reflective ring 69. The gas exhaust hole 86 is communicably connected to a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust hole 86 and the buffer space 87 to the gas exhaust pipe 88. The gas supply hole 81 and the gas exhaust hole 86 may include a plurality of gas supply holes 81 and a plurality of gas exhaust holes 86, respectively, arranged in a circumferential direction of the chamber 6, and may be in the form of slits. The nitrogen gas supply source 85 and the exhaust part 190 may be mechanisms provided in the heat treatment apparatus 1 or be a utility in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
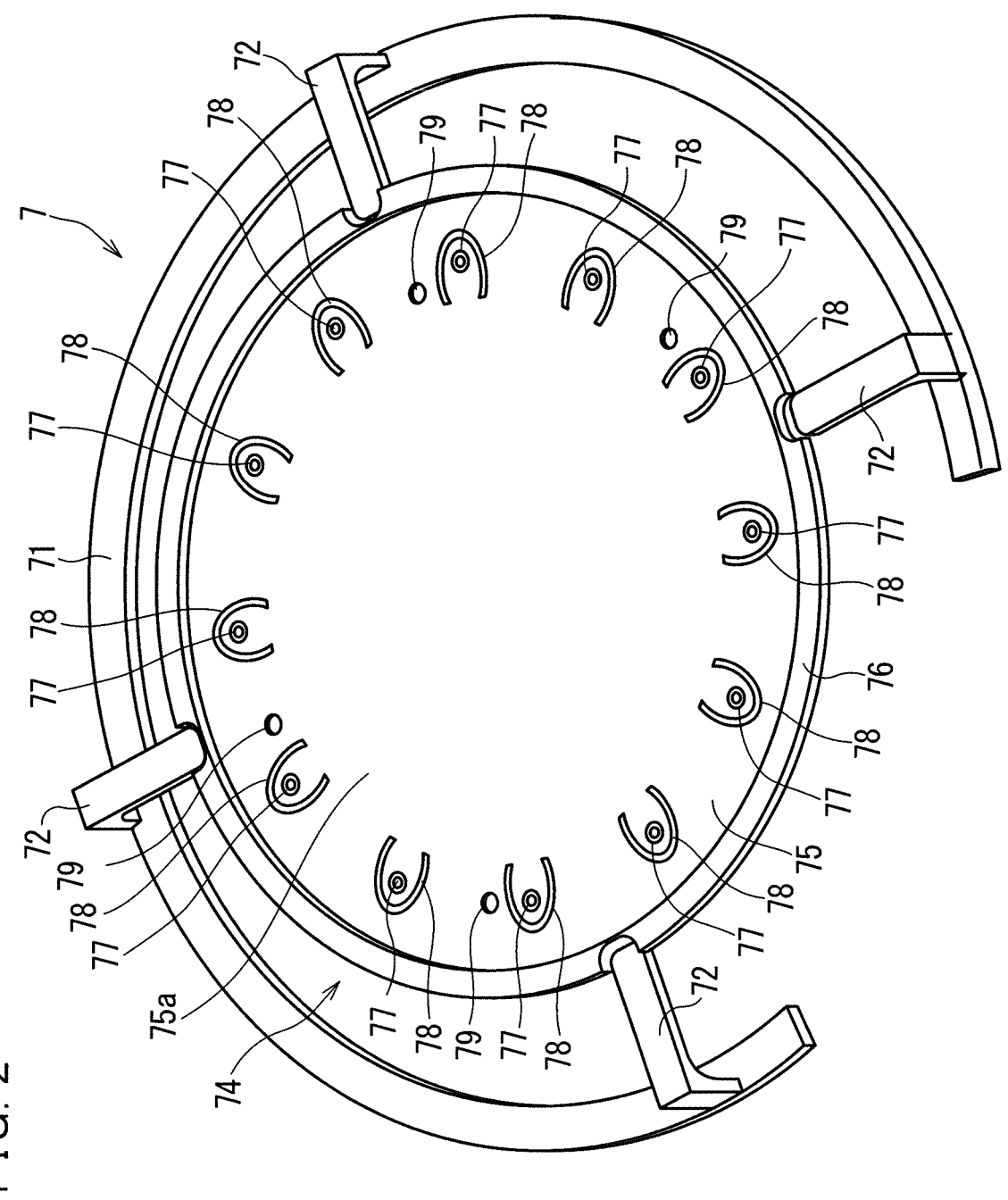
FIG. 2 is a perspective view showing an entire external appearance of a holding part.

FIG. 2 is a perspective view showing an entire external appearance of the holding part 7. The holding part 7 includes a base ring 71, coupling portions 72, and the susceptor 74. The base ring 71, the coupling portions 72, and the susceptor 74 are all formed of quartz. In other words, the whole of the holding part 7 is formed of quartz.

The base ring 71 is a quartz member having an arcuate shape obtained by removing a portion from an annular shape. This removed portion is provided to prevent interference between transfer arms 11 of the transfer mechanism 10 described hereinafter and the base ring 71. The base ring 71 is supported by a wall surface of the chamber 6 by being placed on the bottom surface of the recessed portion 62 (with reference to FIG. 1). The plurality of coupling portions 72 (in the present embodiment, four coupling portions 72 at intervals of 90 degrees) are mounted upright on the upper surface of the base ring 71 and arranged in a circumferential direction of the annular shape thereof. The coupling portions 72 are also quartz members, and are rigidly secured to the base ring 71 by welding.

Figures 3, 4:
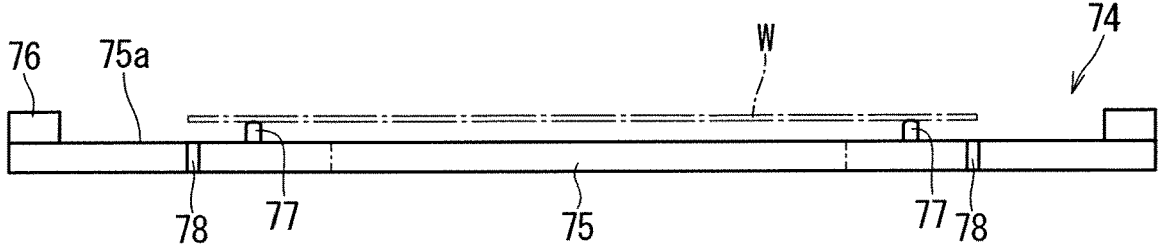
FIG. 3 is a plan view of a susceptor.
FIG. 4 is a cross-sectional view showing an A-A cross section in FIG. 3.

The susceptor 74 is supported by the four coupling portions 72 provided on the base ring 71. FIG. 3 is a plan view of the susceptor 74. FIG. 4 is a cross-sectional view showing an A-A cross section in FIG. 3. The susceptor 74 includes a holding plate 75, a guide ring 76, and a plurality of substrate support pins 77. The holding plate 75 is a generally circular planar member formed of quartz. A diameter of the holding plate 75 is larger than that of the semiconductor wafer W. In other words, the holding plate 75 has a size, as seen in a plan view, larger than that of the semiconductor wafer W.

The guide ring 76 is provided on a peripheral part of the upper surface of the holding plate 75. The guide ring 76 is an annular member having an inner diameter larger than the diameter of the semiconductor wafer W. For example, when the diameter of the semiconductor wafer W is 300 mm, the inner diameter of the guide ring 76 is 320 mm. The inner periphery of the guide ring 76 is in a form of a tapered surface which becomes wider in an upward direction from the holding plate 75. The guide ring 76 is formed of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75*a* for holding the semiconductor wafer W. The plurality of substrate support pins 77 are mounted upright on the holding surface 75*a* of the holding plate 75. In the present embodiment, a total of 12 substrate support pins 77 mounted upright are spaced at intervals of 30 degrees along the circumference of a circle concentric with the outer circumference of the holding surface 75*a*. The diameter of the circle on which the 12 substrate support pins 77 are disposed (the distance between opposed ones of the substrate support pins 77) is smaller than the diameter of the semiconductor wafer W, and is 270 to 280 mm (in the present embodiment, 280 mm) when the diameter of the semiconductor wafer W is 300 mm. Each of the substrate support pins 77 is formed of quartz. The plurality of substrate support pins 77 may be provided by welding on the upper surface of the holding plate 75 or machined integrally with the holding plate 75. A height of each substrate support pin 77 is 0.8 mm to 2 mm, and is preferably 0.8 mm to 1.2 mm.

As shown in FIG. 2, the four coupling portions 72 mounted upright on the base ring 71 and the peripheral part of the holding plate 75 of the susceptor 74 are rigidly secured to each other by welding. In other words, the susceptor 74 and the base ring 71 are fixedly coupled to each other with the coupling portions 72. The base ring 71 of such a holding part 7 is supported by the wall surface of the chamber 6, whereby the holding part 7 is mounted to the chamber 6. With the holding part 7 mounted to the chamber 6, the holding plate 75 of the susceptor 74 assumes a horizontal attitude (an attitude such that the normal to the holding plate 75 coincides with a vertical direction). In other words, the holding surface 75*a* of the holding plate 75 becomes a horizontal surface.

The semiconductor wafer W transported into the chamber 6 is placed and held in a horizontal attitude on the susceptor 74 of the holding part 7 mounted to the chamber 6. At this time, the semiconductor wafer W is supported by the 12 substrate support pins 77 mounted upright on the holding plate 75, and is held by the susceptor 74. More strictly speaking, the 12 substrate support pins 77 have respective upper end portions coming in point contact with the lower surface of the semiconductor wafer W to support the semiconductor wafer W. The semiconductor wafer W can be supported in a horizontal attitude by the 12 substrate support pins 77 because the 12 substrate support pins 77 have a uniform height (distance from the upper ends of the substrate support pins 77 to the holding surface 75*a* of the holding plate 75). The semiconductor wafer W supported by the plurality of substrate support pins 77 is spaced a predetermined distance apart from the holding surface 75*a* of the holding plate 75.

As shown in FIG. 2 to FIG. 4, a plurality of slits 78 are formed in the holding plate 75 of the susceptor 74. Each slit 78 is located around a position where each substrate support pin 77 is mounted upright. In the present embodiment, the slits 78 are formed around all of positions where the substrate support pins 77 are mounted upright, respectively. In other words, the slits 78 are formed around all of positions where the 12 substrate support pins 77 are mounted upright, respectively. The slit 78 includes a curved portion (or bending portion) 78*t*. In the present embodiment, a shape of the slit 78 is a U-like shape having an opening portion directed to a central portion of the holding plate 75. That is to say, as shown in FIG. 3, an end portion 78*e* is directed to the central portion of the holding plate 75, and the curved portion 78*t* is directed to an end portion of the holding plate 75. Each slit 78 is a notch vertically passing through the holding plate 75. Each slit 78 is formed so that the substrate support pin 77 is located inside the U-like shape.

The holding plate 75 of the susceptor 74 further includes four through holes 79 bored therein and designed so that lift pins 12 of the transfer mechanism 10 described hereinafter pass through the through holes 79, respectively, to transfer the semiconductor wafer W. Furthermore, opening (not shown) is provided for a radiation thermometer 20 (see FIG. 1) to receive radiation (infrared radiation) emitted from the lower surface of the semiconductor wafer W held by the susceptor 74. The radiation thermometer 20 receives the infrared radiation emitted from the lower surface of the semiconductor wafer W held by the susceptor 74 to measure the temperature of the semiconductor wafer W.

Figure 5:
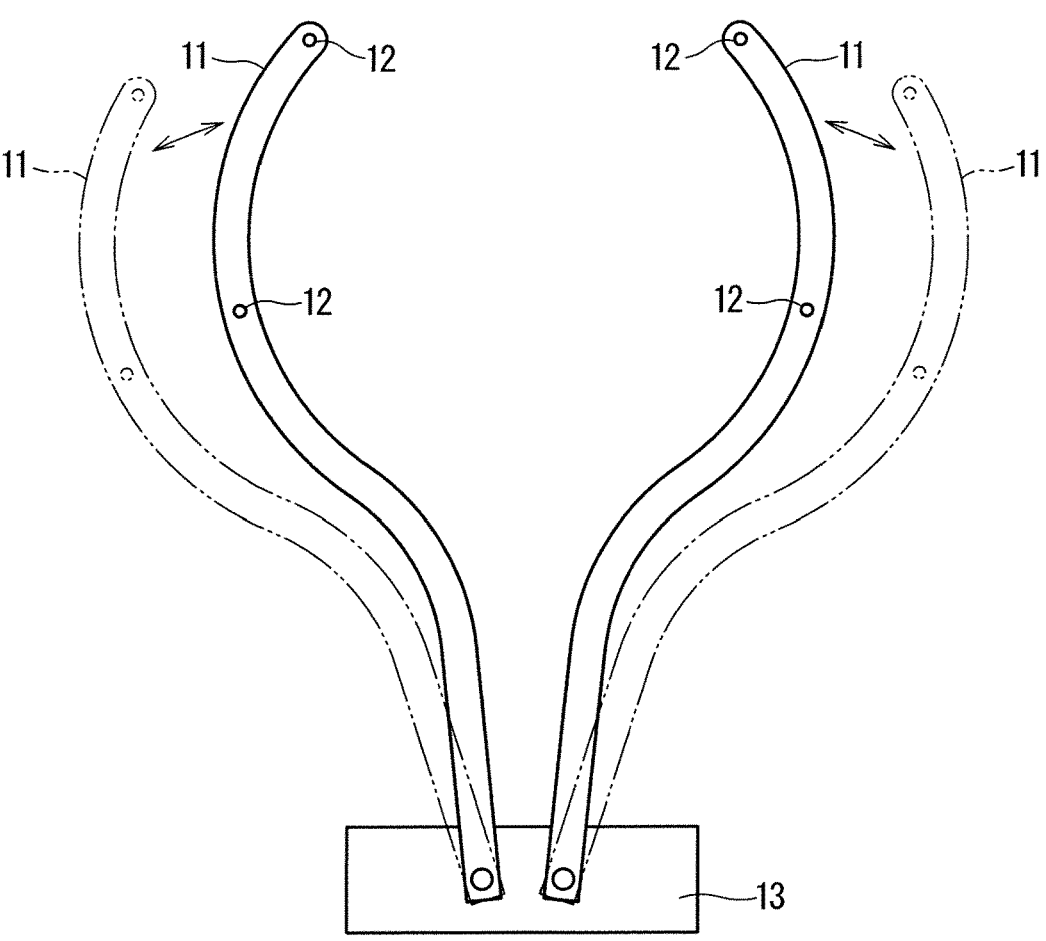
FIG. 5 is a plan view of a transfer mechanism.
Figure 6:
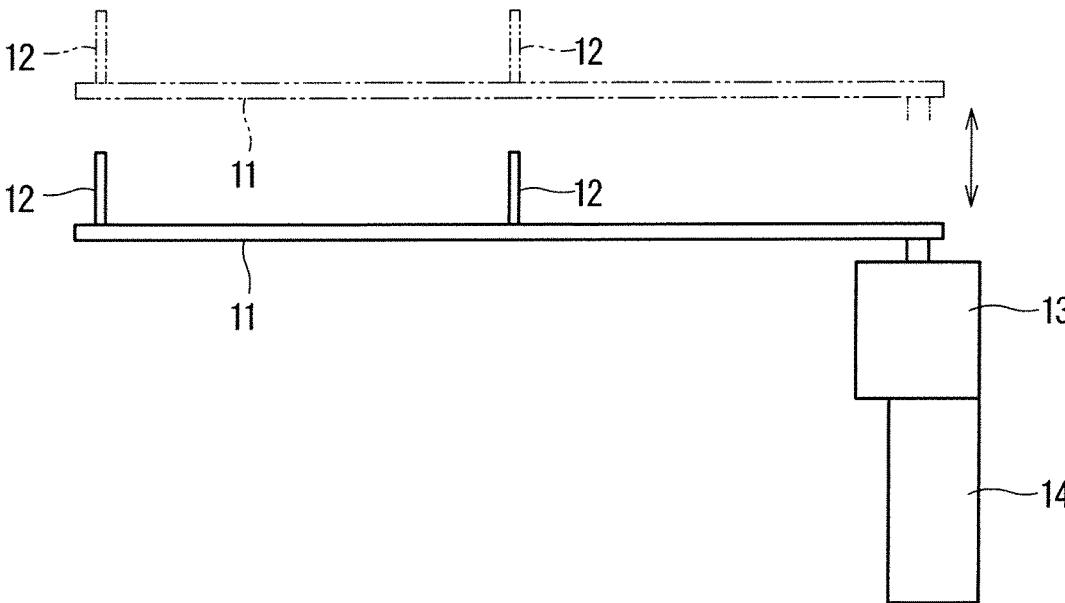
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which the semiconductor wafer W is transferred to and from the holding part 7 and a retracted position (a position indicated by dash-double-dot lines in FIG. 5) in which the transfer arms 11 do not overlap the semiconductor wafer W held by the holding part 7 as seen in a plan view. The horizontal movement mechanism 13 may be of the type which causes individual motors to pivot the transfer arms 11 respectively or of the type which uses the linkage mechanism to cause a single motor to pivot the pair of transfer arms 11 in cooperative relation.

The pair of transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holding part 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The plurality of flash lamps FL, each of which is a rod-shaped lamp having an elongated cylindrical shape, are arranged in a plane so that the longitudinal directions of the respective flash lamps FL are in parallel with each other along a main surface of the semiconductor wafer W held by the holding part 7 (that is, in the horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to an outer peripheral surface of the glass tube. Because the xenon gas is electrically insulative, no current flows in the glass tube in a normal state even if electrical charge is stored in the capacitor. However, if high voltage is applied to the trigger electrode to produce an electrical breakdown, electricity stored in the capacitor flows momentarily in the glass tube, and xenon atoms or molecules are excited at this time to cause light emission. This xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect the flash of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present embodiment, 40) halogen lamps HL. The halogen heating part 4 is a light irradiation part which directs light from under the chamber 6 through the lower chamber window 64 toward the heat treatment space 65 to heat the semiconductor wafer W by means of the halogen lamps HL.

FIG. 7 is a plan view showing an arrangement of the plurality of halogen lamps HL. The 40 halogen lamps HL are arranged in two tiers, i.e. upper and lower tiers. 20 halogen lamps HL are arranged in the upper tier closer to the holding part 7, and 20 halogen lamps HL are arranged in the lower tier farther from the holding part 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of the semiconductor wafer W held by the holding part 7 (that is, in the horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral part of the semiconductor wafer W held by the holding part 7 than in a region opposed to a central portion thereof. In other words, the halogen lamps HL in each of the upper and lower tiers are arranged at shorter intervals in the peripheral part of the lamp arrangement than in the central portion thereof. This allows a greater amount of light to impinge upon the peripheral part of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. Gas prepared by introducing a halogen element (iodine, bromine and the like) in trace amounts into inactive gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for at least not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined treatment program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of the semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a treatment procedure of the semiconductor wafer W in the heat treatment apparatus 1 will be described. The semiconductor wafer W to be treated herein is a semiconductor substrate to which an impurity (ion) is added by an ion implantation method. The impurity is activated by a flash irradiation heat treatment (anneal) performed by the heat treatment apparatus 1. The treatment procedure in the heat treatment apparatus 1 described hereinafter proceeds when the controller 3 controls each operation mechanism of the heat treatment apparatus 1.

Firstly, the valve 84 is opened for supply of gas, and the valves 89 and 192 for exhaust of gas are opened, so that the supply and exhaust of gas into and out of the chamber 6 start. When the valve 84 is opened, nitrogen gas is supplied from the gas supply opening 81 into the heat treatment space 65. Also, when the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts also an atmosphere near the drivers of the transfer mechanism 10. The nitrogen gas is continuously supplied into the heat treatment space 65 at the time of the heat treatment of the semiconductor wafer W in the heat treatment apparatus 1, and an amount of supply is appropriately changed in accordance with a treatment process.

Subsequently, the gate valve 162 is opened to open the transport opening 66. A transport robot outside the heat treatment apparatus 1 transports the semiconductor wafer W after ion implantation through the transport opening 66 into the heat treatment space 65 in the chamber 6. The semiconductor wafer W transported into the heat treatment space 65 by the transport robot is moved forward to a position lying immediately over the holding part 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 162 closes the transport opening 66. Then, the pair of transfer arms 11 moves downwardly to transfer the semiconductor wafer W from the transfer mechanism 10 to the susceptor 74 of the holding part 7, so that the semiconductor wafer W is held in a horizontal attitude from below. The semiconductor wafer W is supported by the substrate support pins 77 mounted upright on the holding plate 75, and is held by the susceptor 74. The semiconductor wafer W is held by the holding part 7 in such an attitude that the front surface thereof where a pattern is formed and the impurity is implanted is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in the horizontal attitude from below by the susceptor 74 of the holding part 7, the 40 halogen lamps HL in the halogen heating part 4 are turned on at the same time and preheating (or assist-heating) is started. Halogen light emitted from the halogen lamps HL is transmitted through the lower chamber window 64 and the susceptor 74 both made of quartz, and impinges from the back surface of the semiconductor wafer W. By receiving irradiation with light from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. That is to say, the radiation thermometer 20 receives infrared radiation emitted from the back surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 is set to be approximately 200° C. to 800° C., and is preferably set to be approximately 350° C. to 600° C., so that there is no possibility of diffusion of the impurity added to the semiconductor wafer W caused by the heat (600° C. in the present embodiment).

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Furthermore, the inner peripheral surface of the lower reflective ring 69 mounted on the chamber side portion 61 has a mirror surface, and this causes a greater amount of light reflected from the inner peripheral surface of the lower reflective ring 69 toward the peripheral portion of the semiconductor wafer W, thereby providing a uniform in-plane temperature distribution of the semiconductor wafer W in the stage of preheating.

At a time when a predetermined period of time has elapsed since the temperature of the semiconductor wafer W reaches the preheating temperature T1 by the irradiation with light from the halogen lamps HL, the flash lamps FL of the flash heating part 5 irradiate the front surface of the semiconductor wafer W with a flash of light. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such a flash of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W is increased instantaneously to a treatment temperature T2 of 1000° C. or more by the flash irradiation from the flash lamps FL, and after the impurity implanted into the semiconductor wafer W is activated, the temperature of the front surface decreases rapidly. In this manner, the heat treatment apparatus 1 can increase and decrease the temperature of the front surface of the semiconductor wafer W in the extremely short time, thus the diffusion of the impurity implanted into the semiconductor wafer W caused by the heat can be suppressed and the impurity can be activated. The time required for the activation of the impurity is extremely shorter than the time required for a heat diffusion, thus the activation is completed in a short time of approximately 0.1 milliseconds to 100 milliseconds in which the diffusion does not occur.

The temperature of the front surface of the semiconductor wafer W is increased instantaneously to the treatment temperature T2 of 1000° C. or more by the flash irradiation, however, the temperature of the back surface thereof does not increase so much from the preheating temperature T1. That is to say, a difference in temperature instantaneously occurs between the front surface and the back surface of the semiconductor wafer W. As a result, rapid thermal expansion occurs only in the front surface of the semiconductor wafer W, and thermal expansion hardly occurs in the back surface, thus the semiconductor wafer W is momentarily warped such that the front surface thereof is formed into a convex surface. Subsequently, heat is also conducted from the front surface to the back surface of the semiconductor wafer W in the next moment, and the semiconductor wafer W is warped such that the back surface thereof is formed into a convex surface with a rebound of the warpage in which the front surface is formed into a convex surface as described above. Subsequently, the semiconductor wafer W oscillates due to repetitive warpage such that the front surface and the back surface thereof are alternately formed into the convex surface.

Herein, in a case where the susceptor 74 in which the slit 78 is not formed is firmly supported by the base ring 71 and the four coupling portions 72 as with a conventional case, an edge portion of the semiconductor wafer W collides with the upper surface of the susceptor 74 when the semiconductor wafer W is warped such that the front surface thereof is formed into the convex shape. In contrast, when the semiconductor wafer W is warped such that the back surface thereof is formed into the convex shape, a central portion of the semiconductor wafer W collides with the upper surface of the susceptor 74. As a result, the semiconductor wafer W bounces, a damage occurs in the upper surface of the susceptor 74, or wafer breakage may occur in a worst case.

Thus, in the heat treatment apparatus 1 according to the present invention, the slit 78 is carved and provided in the holding plate 75 of the susceptor 74. In the first embodiment, each of the slits 78 having a U-like shape is formed to surround the 12 substrate support pins 77 of the holding plate 75.

FIG. 8 is an explanation diagram illustrating an action of the semiconductor wafer W held by the susceptor 74 and the holding plate 75 at a time of flash irradiation. FIG. 9 is a partial enlarged view showing an enlarged substrate support pin 77 and slit 78 in FIG. 8. When the semiconductor wafer W is warped such that the front surface thereof is formed into the convex surface at the time of flash irradiation, the substrate support pin 77 receives pressing force toward a lower side direction of the semiconductor wafer W by the warpage of the semiconductor wafer W. Accordingly, a section where the substrate support pin 77 is mounted upright and surrounded by the slit 78 is deflected to be rotated around a point O in a direction of an arrow B in FIG. 9. As a result, stress acting on the semiconductor wafer W at the time of flash irradiation is reduced, and bound and breakage of the semiconductor wafer W can be prevented.

The semiconductor wafer W is generally a thin plate-like substrate made by thinly slicing a cylindrical single crystal silicon ingot (for example, when a diameter thereof is 300 mm, a thickness thereof is 0.775 mm). Thus, the semiconductor wafer W treated in the present embodiment is also formed of single crystal silicon. The semiconductor wafer W is made by slicing a silicon ingot along a specific crystal orientation thereof. Three types of wafer each having a plane orientation of (100) plane, (110) plane, and (111) plane are typically used, and a wafer having a (100) plane orientation is used most commonly. Also in the present embodiment, the semiconductor wafer W to be treated is a single crystal silicon wafer having a plane orientation of (100) plane.

When the semiconductor wafer W having a plane orientation of (100) plane is irradiated with a flash of light, the semiconductor wafer W is warped to extend in a <100> direction. That is to say, the semiconductor wafer W is warped into a convex shape such that both ends of a diameter of the semiconductor wafer W along the <100> direction are located on a lowermost or uppermost side.

When the semiconductor wafer W held by the susceptor 74 is irradiated with a flash of light, the semiconductor wafer W is warped to extend in one of two equivalent <100> directions as illustrated in alternate long and short dash lines in FIG. 8 and FIG. 9. In this manner, the deformation of the semiconductor wafer W is considered to be unequal due to characteristics of a crystal structure of the semiconductor wafer W. In the present embodiment, the slits 78 are formed around all of positions where the substrate support pins 77 are mounted upright, respectively. A deflection amount in a portion around the slit 78 for each substrate support pin 77 can be changed. Accordingly, even when different load is applied to each substrate support pin 77, the load is appropriately absorbed therein.

When the semiconductor wafer W is deformed by a flash irradiation as illustrated in FIG. 9, a maximum deflection amount T in the position where the substrate support pin 77 is mounted upright surrounded by the slit 78 is smaller than a height of the substrate support pin 77. Accordingly, even when a deformation amount of the semiconductor wafer W is large and pressing force is large, contact of the end portion of the semiconductor wafer W with the holding plate 7 can be prevented.

As described above, in the present embodiment, when the semiconductor wafer W is warped such that the front surface thereof is formed into the convex surface by the flash irradiation, a pressed portion in the holding plate 75 pressed by the semiconductor wafer W is deflected to follow the deformation of the semiconductor wafer W. Stress acting on the semiconductor wafer W at the time of flash irradiation is reduced by the deflection of the holding plate 75, and as a result, bound of the semiconductor wafer W from the susceptor 74 at the time of flash irradiation and breakage thereof can be prevented.

When the flash heat treatment is finished, the halogen lamps HL are turned off after an elapse of a predetermined period of time. Accordingly, the temperature of the semiconductor wafer W decreases rapidly from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 162, and the transport robot outside the heat treatment apparatus 1 transports the semiconductor wafer W placed on the lift pins 12 to the outside. Thus, the heating treatment on the semiconductor wafer W in the heat treatment apparatus 1 is completed.

In the first embodiment, when the semiconductor wafer W is deformed such that the front surface thereof is formed into the convex surface by the flash irradiation from the flash lamps FL, the slit 78 is formed around the position where the substrate support pin 77 is mounted upright as the pressed portion in the holding plate 75 pressed by the semiconductor wafer W. Accordingly, even when load on the substrate support pin 77 is increased in accordance with a deformation of the substrate at the time of flash irradiation, a portion surrounded by the slit 78 is deflected, thus the load on the substrate support pin 77 is absorbed.

It is considered that there are two <100> directions in which the semiconductor wafer W extends at the time of flash irradiation to be perpendicular to each other in the plane of the semiconductor wafer W. Four positions in total of both ends thereof have a possibility of pressing the semiconductor wafer W at the time of flash irradiation. Thus, the slit 78 is also formed in a pressed portion, in the holding plate 75, considered to be pressed by the semiconductor wafer W with particularly large force at the time of flash irradiation. Particularly, in the present embodiment, the slits 78 are formed around all of the positions where 12 substrate support pins 77 are mounted upright, respectively. Thus, even when the semiconductor wafer W is deformed to extend in any of the two <100> directions by the flash irradiation or the deformation of the semiconductor wafer W is unequal, the pressed portion in the holding plate 75 (the portion surrounded by the slit 78) can be deflected to follow each deformation of the semiconductor wafer W. Accordingly, stress acting on the semiconductor wafer W can be reduced with a simple configuration of providing the slit 78 to prevent a bound and breakage of the semiconductor wafer W.

Second Embodiment

Next, a second embodiment according to the present invention will be described. A whole configuration of the heat treatment apparatus and a treatment procedure of the semiconductor wafer W in the second embodiment are the same as those of the first embodiment. The second embodiment is different from the first embodiment in a configuration of the susceptor.

FIG. 10 is a plan view of a susceptor 274 in the second embodiment. In FIG. 10, the same sign is assigned to the same element as that in the first embodiment. The susceptor 274 in the second embodiment includes a holding plate 275 and the plurality of substrate support pins 77. A plurality of slits 278 are formed in the holding plate 275 in place of the slits 78 in the first embodiment. Also in the present embodiment, the slits 278 are formed around all of positions where the substrate support pins 77 are mounted upright, respectively, in the manner similar to the slits 78 in the first embodiment. In the present embodiment, a shape of the slit 278 is a U-like shape having an opening portion directed to an end portion of the holding plate 275. That is to say, as shown in FIG. 10, an end portion 278e is directed to the end portion of the holding plate 275, and a curved portion 278t is directed to a central portion of the holding plate 275.

Also in the second embodiment, when the semiconductor wafer W is deformed such that the front surface thereof is formed into the convex surface by the flash irradiation from the flash lamps FL, the slit 278 is formed around the position where the substrate support pin 77 is mounted upright as the pressed portion in the holding plate 275 pressed by the semiconductor wafer W. In the manner similar to the first embodiment, the slit 278 is also formed in a pressed portion, in the holding plate 275, considered to be pressed by the semiconductor wafer W with particularly large force at the time of flash irradiation. The slits 278 are formed around all of the positions where 12 substrate support pins 77 are mounted upright, respectively. Thus, even when the semiconductor wafer W is deformed to extend in any of the two <100> directions by the flash irradiation or the deformation of the semiconductor wafer W is unequal, the pressed portion in the holding plate 275 (the portion surrounded by the slit 278) can be deflected to follow each deformation of the semiconductor wafer W. Accordingly, stress acting on the semiconductor wafer W can be reduced to prevent a bound and breakage of the semiconductor wafer W.

Third Embodiment

Next, a third embodiment according to the present invention will be described. A whole configuration of the heat treatment apparatus and a treatment procedure of the semiconductor wafer W in the third embodiment are the same as those of the first embodiment. The third embodiment is different from the first embodiment in a configuration of the susceptor.

FIG. 11 is a plan view of a susceptor 374 in the third embodiment. In FIG. 11, the same sign is assigned to the same element as that in the first embodiment. The susceptor 374 in the third embodiment includes a holding plate 375 and a plurality of substrate support pins 377. The plurality of substrate support pins 377 are mounted upright on a first circumference C1 and a second circumference C2. A diameter of the second circumference C2 is larger than that of the first circumference. The first circumference C1 and the second circumference C2 are substantially concentric circles. The diameter of the first circumference C1 and the diameter of the second circumference C2 are smaller than that of the semiconductor wafer W.

The first circumference C1 and an outer peripheral circle of a holding surface of the holding plate 375 are substantially concentric circles. A total of 12 substrate support pins 377a mounted upright are spaced at intervals of 30 degrees along the first circumference C1. Slits 378a are formed around all of the positions where 12 substrate support pins 377a are mounted upright, respectively. The slit 378a includes a curved portion. In the present embodiment, a shape of the slit 378a is a U-like shape having an opening portion directed to a central portion of the holding plate 375. That is to say, as shown in FIG. 11, an end portion is directed to the central portion of the holding plate 375, and a curved portion is directed to an end portion of the holding plate 375.

The second circumference C2 and the outer peripheral circle of the holding surface of the holding plate 375 are substantially concentric circles. A total of 12 substrate support pins 377b mounted upright are spaced at intervals of 30 degrees along the second circumference C2. Slits 378b are formed around all of the positions where 12 substrate support pins 377b are mounted upright, respectively. The slit 378b includes a curved portion. In the present embodiment, a shape of the slit 378b is a U-like shape having an opening portion directed to an end portion of the holding plate 375. That is to say, as shown in FIG. 11, an end portion is directed to the end portion of the holding plate 375, and a curved portion is directed to the central portion of the holding plate 375.

Also in the third embodiment, when the semiconductor wafer W is deformed such that the front surface thereof is formed into the convex surface by the flash irradiation from the flash lamps FL, the slit 378 is formed around the position where the substrate support pin 377 is mounted upright as the pressed portion in the holding plate 375 pressed by the semiconductor wafer W. In the manner similar to the first embodiment, the slit 378a or 378b is also formed in a pressed portion, in the holding plate 375, considered to be pressed by the semiconductor wafer W with particularly large force at the time of flash irradiation. The slits 378a are formed around all of the positions where 12 substrate support pins 377a are mounted upright on the first circumference C1, respectively, and the slits 378b are formed around all of the positions where 12 substrate support pins 377b are mounted upright on the second circumference C2, respectively. Thus, even when the semiconductor wafer W is deformed to extend in any of the two <100> directions by the flash irradiation or the deformation of the semiconductor wafer W is unequal, the pressed portion in the holding plate 375 (the portion surrounded by the slit 378a and the portion surrounded by the slit 378b) can be deflected to follow each deformation of the semiconductor wafer W. Accordingly, stress acting on the semiconductor wafer W can be reduced to prevent a bound and breakage of the semiconductor wafer W.

Fourth Embodiment

Next, a fourth embodiment according to the present invention will be described. A whole configuration of the heat treatment apparatus and a treatment procedure of the semiconductor wafer W in the fourth embodiment are the same as those of the third embodiment. The fourth embodiment is different from the third embodiment in a configuration of the susceptor.

FIG. 12 is a plan view of a susceptor 474 in the fourth embodiment. In FIG. 12, the same sign is assigned to the same element as that in the third embodiment. Also in the fourth embodiment, the plurality of substrate support pins 377 are mounted upright on the first circumference C1 and the second circumference C2.

Slits 478a are formed around all of the positions where 12 substrate support pins 377a are mounted upright on the first circumference C1, respectively. The slit 478a also includes a curved portion. In the present embodiment, a shape of the slit 478a is a U-like shape having an opening portion directed to an end portion of the holding plate 475. That is to say, as shown in FIG. 12, an end portion is directed to the end portion of the holding plate 475, and a curved portion is directed to a central portion of the holding plate 475.

In the similar manner, slits 478b are formed around all of the positions where 12 substrate support pins 377b are mounted upright on the second circumference C2, respectively. The slit 478b includes a curved portion. In the present embodiment, a shape of the slit 478b is a U-like shape having an opening portion directed to the central portion of the holding plate 475. That is to say, as shown in FIG. 12, an end portion is directed to the central portion of the holding plate 475, and a curved portion is directed to the end portion of the holding plate 475.

Also in the fourth embodiment, when the semiconductor wafer W is deformed such that the front surface thereof is formed into the convex surface by the flash irradiation from the flash lamps FL, the slit 478 is formed around the position where the substrate support pin 377 is mounted upright as the pressed portion in the holding plate 475 pressed by the semiconductor wafer W. In the manner similar to the third embodiment, the slit 478a or 478b is also formed in a pressed portion, in the holding plate 475, considered to be pressed by the semiconductor wafer W with particularly large force at the time of flash irradiation. The slits 478a are formed around all of the positions where 12 substrate support pins 377a are mounted upright on the first circumference C1, respectively, and the slits 478b are formed around all of the positions where 12 substrate support pins 377b are mounted upright on the second circumference C2, respectively. Thus, even when the semiconductor wafer W is deformed to extend in any of the two <100> directions by the flash irradiation or the deformation of the semiconductor wafer W is unequal, the pressed portion in the holding plate 475 (the portion surrounded by the slit 478a and the portion surrounded by the slit 478*b*) can be deflected to follow each deformation of the semiconductor wafer W. Accordingly, stress acting on the semiconductor wafer W can be reduced to prevent a bound and breakage of the semiconductor wafer W.

Fifth Embodiment

Next, a fifth embodiment according to the present invention will be described. A whole configuration of the heat treatment apparatus and a treatment procedure of the semiconductor wafer W in the fifth embodiment are the same as those of the third embodiment. The fifth embodiment is different from the third embodiment in a configuration of the susceptor.

Figure 13:
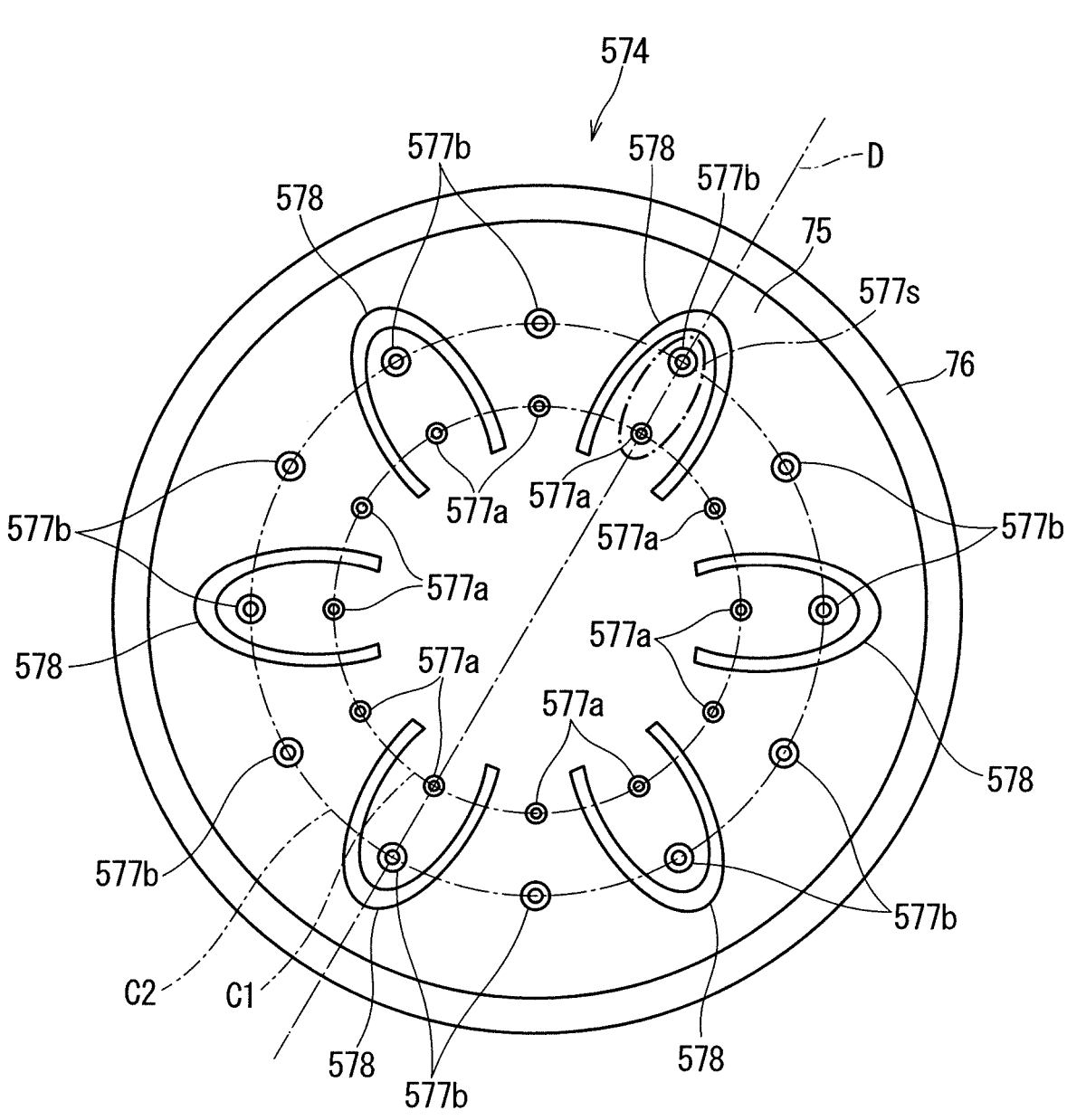
FIG. 13 is a plan view of a susceptor according to a fifth embodiment.

FIG. 13 is a plan view of a susceptor 574 in the fifth embodiment. In FIG. 13, the same sign is assigned to the same element as that in the third embodiment. Also in the fifth embodiment, the plurality of substrate support pins 577 are mounted upright on the first circumference C1 and the second circumference C2. A plurality of substrate support pins 577*a* are mounted upright on the first circumference C1 and a plurality of substrate support pins 577*b* are also mounted upright on the second circumference C2.

A slit 578 is formed to surround a pair of substrate support pins 577*s* made up of one substrate support pin 577*a* and one substrate support pin 577*b* in a holding plate 575 in the present embodiment. The substrate support pin 577*a* mounted upright on the first circumference C1 and the substrate support pin 577*b* mounted upright on the second circumference C2 are disposed on the same diameter D. The substrate support pins 577*a* and 577*b* mounted upright on the different circumferences are disposed on the same diameter D in this manner, thus a space required for the formation of the slit 578 can be reduced. A shape of the slit 578 is a U-like shape having an opening portion directed to a central portion of the holding plate 575. That is to say, as shown in FIG. 13, an end portion is directed to the central portion of the holding plate 575, and a curved portion is directed to an end portion of the holding plate 575.

In the present embodiment, the slits 578 are not formed around all of positions where the substrate support pins 577*a* or the substrate support pins 577*b* are mounted upright. The slits 578 are alternately formed around the adjacent pair of substrate support pins 577*s*. Accordingly, the number of slits can be reduced. The slit 578 is preferably formed on particularly a line along the <100> direction of the semiconductor wafer W. The reason is that, as described above, the semiconductor wafer W is considered to be particularly deformed in the <100> direction easily.

Also in the fifth embodiment, when the semiconductor wafer W is deformed such that the front surface thereof is formed into the convex surface by the flash irradiation from the flash lamps FL, the slit 578 is formed around the position where the substrate support pin 577 is mounted upright as the pressed portion in the holding plate 575 pressed by the semiconductor wafer W. In the manner similar to the third embodiment, the slit 578 is formed in a pressed portion, in the holding plate 575, considered to be pressed by the semiconductor wafer W with particularly large force at the time of flash irradiation. The slits 578 are not formed around all of positions where the substrate support pins 577*a* and 577*b* are mounted upright, however, also in the present embodiment, a pressed portion (a portion surrounded by the slit 578) in the holding plate 575 can be deflected to follow the deformation of the semiconductor wafer W. Accordingly, stress acting on the semiconductor wafer W can be reduced to prevent a bound and breakage of the semiconductor wafer W.

Sixth Embodiment

Next, a sixth embodiment according to the present invention will be described. A whole configuration of the heat treatment apparatus and a treatment procedure of the semiconductor wafer W in the sixth embodiment are the same as those of the first embodiment. The sixth embodiment is different from the first embodiment in a configuration of the susceptor.

Figure 14:
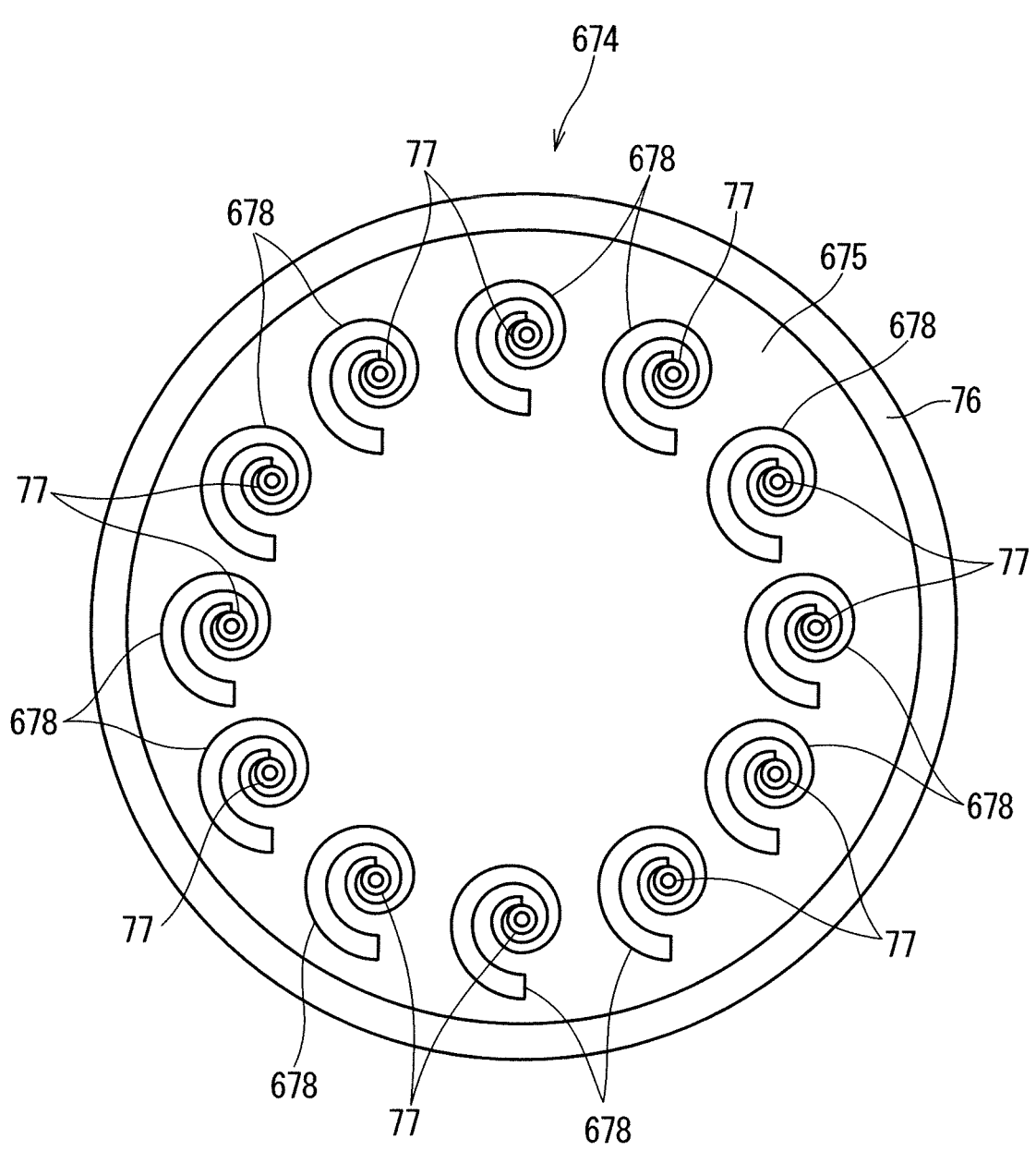
FIG. 14 is a plan view of a susceptor according to a sixth embodiment.

FIG. 14 is a plan view of a susceptor 674 in the sixth embodiment. In FIG. 14, the same sign is assigned to the same element as that in the first embodiment. The susceptor 674 in the sixth embodiment includes a holding plate 675 and the plurality of substrate support pins 77. A plurality of slits 678 are formed in the holding plate 675 in place of the slits 78 in the first embodiment. Also in the present embodiment, the slits 678 are formed around all of positions where the substrate support pins 77 are mounted upright, respectively, in the manner similar to the slits 78 in the first embodiment. In the present embodiment, a shape of the slit 689 is a spiral shape. Load is considered to be concentrated in the opening portion in the U-like shape when the portion surrounded by the slit 78 is deflected. In the meanwhile, load is considered to be hardly concentrated in part of the slit by reason that a whole periphery of the substrate support pin is deflected when the portion surrounded by the slit 78 is deflected. Thus, increase in life of the holding plate 675 can be expected.

Also in the sixth embodiment, when the semiconductor wafer W is deformed such that the front surface thereof is formed into the convex surface by the flash irradiation from the flash lamps FL, the slit 678 is formed around the position where the substrate support pin 77 is mounted upright as the pressed portion in the holding plate 675 pressed by the semiconductor wafer W. In the manner similar to the first embodiment, the slit 678 is also formed in a pressed portion, in the holding plate 275, considered to be pressed by the semiconductor wafer W with particularly large force at the time of flash irradiation. The slits 678 are formed around all of the positions where 12 substrate support pins 77 are mounted upright, respectively. Thus, even when the semiconductor wafer W is deformed to extend in any of the two <100> directions by the flash irradiation or the deformation of the semiconductor wafer W is unequal, the pressed portion in the holding plate 675 (the portion surrounded by the slit 678) can be deflected to follow each deformation of the semiconductor wafer W. Accordingly, stress acting on the semiconductor wafer W can be reduced to prevent a bound and breakage of the semiconductor wafer W.

Other

Figure 15:
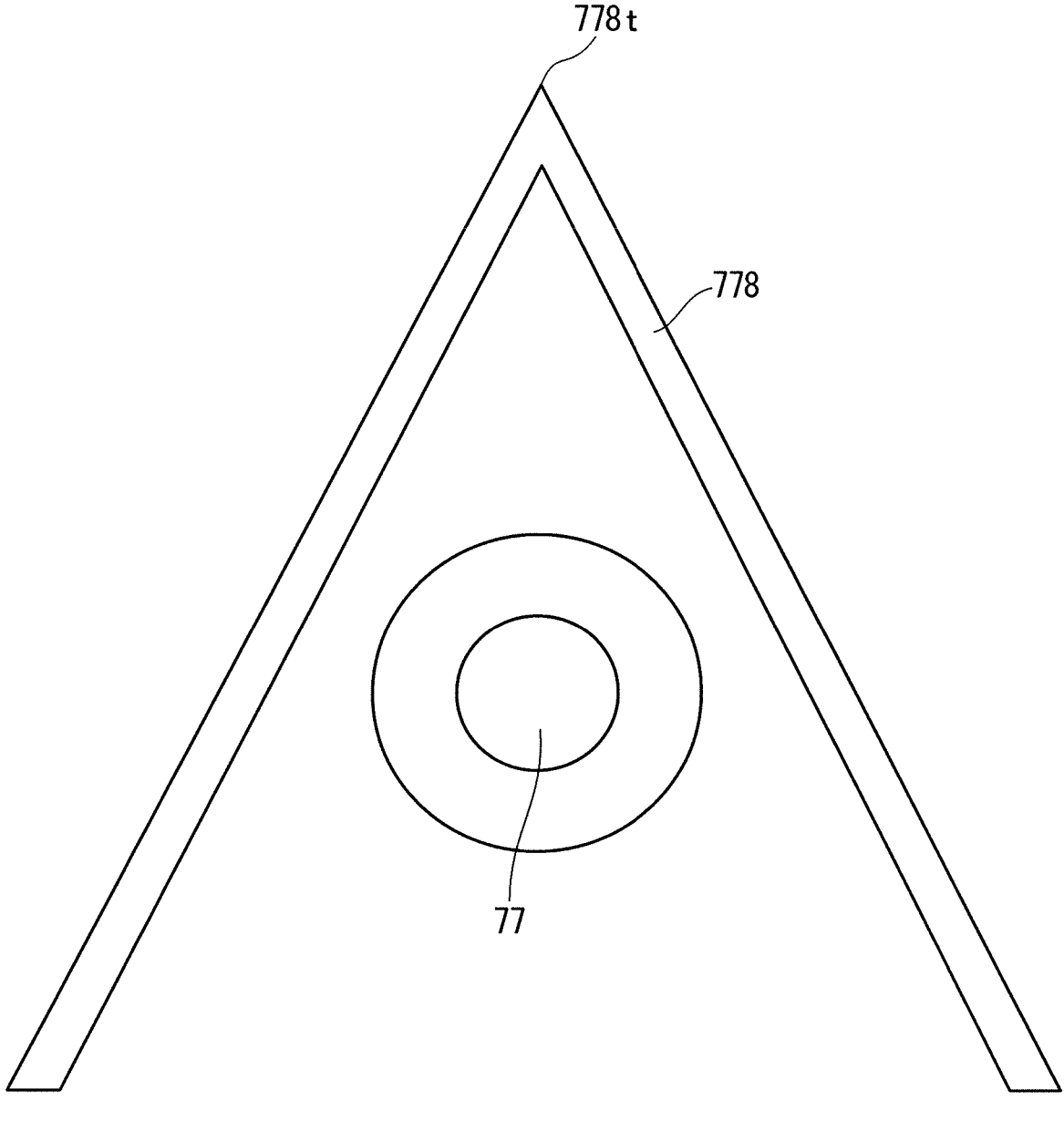
FIG. 15 is an explanation diagram illustrating a shape of a slit of the other example.

FIG. 15 is an explanation diagram illustrating a shape of a slit 778 of the other example. As illustrated in FIG. 15, the slit 778 includes a corner portion 778*t* in place of the curved portion. That is to say, a shape of the slit 778 is not a U-like shape but is a V-like shape.

In the first to fourth embodiment and the sixth embodiment, the slits 78, 278, 378, 478, and 678 are formed around all of the positions where the substrate support pins 77 and 377 are mounted upright, however, the configuration is not limited thereto. When each of the slits 78, 278, 378, 478, and 678 is formed around at least one substrate support pin 77, stress acting on the semiconductor wafer W can be reduced to prevent a bound and breakage of the semiconductor wafer W.

In the third and fourth embodiments, the substrate support pin 377a mounted upright on the first circumference C1 and the substrate support pin 377b mounted upright on the second circumference C2 are not disposed on the same diameter in the drawings, however, this configuration is not limited thereto. It is also applicable that the substrate support pin 377a mounted upright on the first circumference C1 and the substrate support pin 377b mounted upright on the second circumference C2 are disposed on the same diameter as with the fifth embodiment.

The shape of the slit is not limited to the shapes of the slits in the first to sixth embodiments. Any shape is applicable to the slit as long as it includes at least one curved portion or corner portion. That is to say, applicable is a configuration that a slit is formed in the holding plate 75 so that the pressed portion in the holding plate 75 pressed by the semiconductor wafer W is deflected when the semiconductor wafer W is deformed by the flash irradiation from the flash lamps FL. When the slit is formed in this manner, the pressed portion of the holding plate 75 is deflected to follow the deformation of the semiconductor wafer W, and stress acting on the semiconductor wafer W can be reduced to prevent a bound and breakage of the semiconductor wafer W.

Although the 30 flash lamps FL are provided in the flash heating part 5 according to the aforementioned embodiment, the present invention is not limited thereto. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

The substrate to be treated by the heat treatment apparatus according to the present invention is not limited to the semiconductor wafer, but a glass substrate used for a flat panel display in a liquid crystal display device, for example, or a substrate for a solar cell are also applicable. Also, the technique according to the present invention may be applied to the heat treatment of high dielectric constant gate insulator films (high-k films), to the joining of metal and silicon, and to the crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment susceptor holding a substrate when the substrate is irradiated with a flash of light from flash lamps to perform a heat treatment on the substrate, the heat treatment susceptor comprising:

a holding plate having a planar holding surface; and a plurality of substrate support bodies mounted upright on the holding surface, wherein at least one slit is formed around a position where at least one of the substrate support bodies is mounted upright in the holding plate, and the slit includes at least one bending portion or one corner portion surrounding at least one of the substrate support bodies, the plurality of substrate support bodies are mounted upright on a first circumference and a second circumference having a larger diameter than a diameter of the first circumference, the slit having a U-like shape or a V-like shape with an opening portion directed to the central portion of the holding plate is formed around a position where each of the substrate support bodies are mounted upright on the first circumference, and the slit having a U-like shape or a V-like shape with an opening portion directed to an end portion of the holding plate is formed around a position where each of the substrate support bodies are mounted upright on the second circumference.

2. The heat treatment susceptor according to claim 1, wherein the slits are formed around all of positions where the plurality of substrate support bodies are mounted upright.

3. The heat treatment susceptor according to claim 1, wherein a maximum deflection amount in a portion surrounded by the slit occurring when the substrate presses the slit via each of the substrate support bodies at a time of deformation of the substrate due to flash irradiation from the flash lamps is smaller than a height of each of the substrate support bodies mounted upright.

4. The heat treatment susceptor according to claim 1, wherein a position where each of the substrate support bodies is mounted upright surrounded by the slit is deflected to be rotated when the substrate is deformed by flash irradiation from the flash lamps.

5. A heat treatment apparatus heating a substrate by irradiating the substrate with a flash of light, the heat treatment apparatus comprising:

a chamber housing the substrate;

the heat treatment susceptor according to claim 1 disposed inside the chamber, and flash lamps irradiating the substrate held by the heat treatment susceptor with the flash of light.

* * * * *